United States Patent
Ruffell et al.

(10) Patent No.: US 10,546,730 B2
(45) Date of Patent: *Jan. 28, 2020

(54) FILLING A CAVITY IN A SUBSTRATE USING SPUTTERING AND DEPOSITION

(71) Applicant: Varian Semiconductor Equipment Associates, Inc., Gloucester, MA (US)

(72) Inventors: Simon Ruffell, South Hampton, MA (US); John Hautala, Beverly, MA (US)

(73) Assignee: VARIAN SEMICONDUCTOR EQUIPMENT ASSOCIATES, INC, Gloucester, MA (US)

(*) Notice: Subject to any disclaimer, the term of this patent is extended or adjusted under 35 U.S.C. 154(b) by 524 days.

This patent is subject to a terminal disclaimer.

(21) Appl. No.: 15/155,282

(22) Filed: May 16, 2016

(65) Prior Publication Data

US 2017/0330796 A1 Nov. 16, 2017

(51) Int. Cl.
*H01L 21/68* (2006.01)
*H01J 37/32* (2006.01)
(Continued)

(52) U.S. Cl.
CPC ...... *H01J 37/32449* (2013.01); *C23C 14/046* (2013.01); *C23C 16/042* (2013.01); *C23C 16/045* (2013.01); *C23C 16/047* (2013.01); *C23C 16/402* (2013.01); *C23C 16/4583* (2013.01); *C23C 16/45523* (2013.01); *C23C 16/50* (2013.01); *H01J 37/3467* (2013.01); *H01J 37/3476* (2013.01);
(Continued)

(58) Field of Classification Search
CPC ........... H01L 21/76879; C23C 14/0026; C23C 14/0042; C23C 14/0063; C23C 14/0068; C23C 14/046; C23C 14/042; C23C 16/042; C23C 16/047; C23C 16/402; C23C 16/45523; C23C 16/4583; C23C 16/50; C23C 16/045; H01J 37/32449; H01J 37/3467; H01J 37/3476

See application file for complete search history.

(56) References Cited

U.S. PATENT DOCUMENTS 6,106,677 A 8/2000 Sandhu
6,207,524 B1 3/2001 Gutsche
(Continued)

OTHER PUBLICATIONS

Jeannine M. Perchard, et al., Characterization of a Multiple-Step In-Situ Plasma Enhanced Chemical Vapor Deposition (PECVD) Tetraethylorthosilicate (TEOS) Planarization Scheme for Submicron Manufacturing, Processing of Electronic Materials, Feb. 15, 1990, pp. 75-85, vol. 75.

(Continued)

*Primary Examiner* — Joseph A Miller, Jr.

(57) ABSTRACT

A method may include providing a cavity in a surface of a substrate, the cavity comprising a sidewall portion and a lower surface; directing depositing species to the surface of the substrate, wherein the depositing species condense to form a fill material on the sidewall portion and lower surface; and directing angled ions at the cavity at a non-zero angle of incidence with respect to a perpendicular to a plane defined by the substrate, wherein the angled ions strike an exposed part of the sidewall portion and do not strike the lower surface, and wherein the cavity is filled by the fill material in a bottom-up fill process.

12 Claims, 9 Drawing Sheets

(51) Int. Cl.
*C23C 14/04* (2006.01)
*H01J 37/34* (2006.01)
*C23C 16/04* (2006.01)
*C23C 16/455* (2006.01)
*C23C 16/458* (2006.01)
*C23C 16/50* (2006.01)
*C23C 16/40* (2006.01)
*H01L 21/285* (2006.01)
*H01L 21/768* (2006.01)

(52) U.S. Cl.
CPC .... *H01L 21/2855* (2013.01); *H01L 21/28556* (2013.01); *H01L 21/76877* (2013.01)

(56) References Cited

U.S. PATENT DOCUMENTS

| | | | |
|---|---|---|---|
| 8,497,212 | B2 | 7/2013 | Babich et al. |
| 2001/0054769 | A1* | 12/2001 | Raaijmakers ......... C23C 16/045 |
| | | | 257/758 |
| 2004/0222082 | A1* | 11/2004 | Gopalraja ............. C23C 14/046 |
| | | | 204/192.3 |
| 2007/0051622 | A1* | 3/2007 | Tang .................... C23C 14/3442 |
| | | | 204/298.01 |
| 2014/0017817 | A1* | 1/2014 | Godet .................... H01L 43/12 |
| | | | 438/3 |
| 2014/0357080 | A1 | 12/2014 | Lisi et al. |
| 2015/0093907 | A1* | 4/2015 | Yieh ................. H01L 21/67017 |
| | | | 438/758 |

OTHER PUBLICATIONS

D.T.C. Huo, et al., Planarization of SiO2 films using reactive ion beam in plasma enhanced chemical vapor deposition, Journal of Applied Physics, 1991, pp. 6637-6642, vol. 69.

D.R.Cote, et al., Low-temperature chemical vapor deposition processes and dielectrics for microelectronic circuit manufacturing at IBM, IBM Journal of Research and Development, 1995, pp. 437-464, vol. 39, Issue 4.

* cited by examiner

FILLING A CAVITY IN A SUBSTRATE USING SPUTTERING AND DEPOSITION

FIELD

The present embodiments relate to processing techniques, and more particularly, to electronic device processing.

BACKGROUND

As electronic devices, such as semiconductor devices, continue to scale to smaller dimensions, the ability to properly build device features becomes increasingly difficult. These difficulties include the ability to fill small structures such as trenches or vias formed within a substrate. Known processes such as chemical vapor deposition (CVD) may fill a cavity in a somewhat conformal matter where coating takes place on exposed surfaces of the cavity. For trenches or vias having a high aspect ratio, an initially conformal process may result in the development of overhangs, leading to the formation of seams or buried holes within a trench, for example.

With respect to these and other considerations the present disclosure is provided.

BRIEF SUMMARY

In one embodiment, a method may include providing a cavity in a surface of a substrate, the cavity comprising a sidewall portion and a lower surface; directing a depositing species to the surface of the substrate, wherein the depositing species condense to form a fill material on the sidewall portion and lower surface; and directing angled ions at the cavity at a non-zero angle of incidence with respect to a perpendicular to a plane defined by the substrate, wherein the angled ions strike an exposed part of the sidewall portion and do not strike the lower surface, and wherein the cavity is filled by the fill material in a bottom-up fill process.

In another embodiment, a processing apparatus may include a plasma chamber to receive a sputtering gas flow from a first gas source and a reactive precursor gas flow from a second gas source. The processing apparatus may further include a process chamber disposed adjacent the process chamber and housing a substrate, the substrate comprising a cavity having a sidewall portion and a lower surface; a plasma generator coupled to the plasma chamber and generating a plasma comprising sputtering gas derived from the sputtering gas flow and a reactive species derived from the reactive precursor gas flow, the reactive species generating a fill material at the substrate; an extraction plate disposed between the plasma chamber and substrate and comprising an extraction aperture; and a bias voltage source generating a bias voltage according to a bias voltage signal between the substrate and plasma chamber, wherein an angled ion beam is directed to the substrate through the extraction plate, the angled ion beam comprising angled ions incident at a surface of the substrate at a non-zero angle of incidence with respect to a perpendicular to a plane defined by the substrate. The processing apparatus may also include a controller coupled to the bias voltage source, the plasma generator, the first gas source, and second gas source, the controller including a component to control the bias voltage signal, the reactive precursor gas flow, the sputtering gas flow, wherein the cavity is filled by the fill material in a bottom-up fill process.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

This present embodiments provide novel techniques and apparatus to fill cavities such as trenches or vias in a substrate. As used herein the term "substrate" may refer to an entity such as a semiconductor wafer, insulating wafer, ceramic, as well as any layers or structures disposed thereon. As such, a surface feature, layer, series of layers, or other entity may be deemed to be disposed on a substrate, where the substrate may represent a combination of structures, such as a silicon wafer, oxide layer, and so forth.

In various embodiments, the surface feature may be used for patterning a layer disposed underneath the surface feature. Examples of a surface feature include a cavity formed within a layer, such as a via, or trench. The term "cavity" may also refer to a structure such as a depression or recess formed within a substrate, extending from an exposed surface of the substrate below the substrate surface. The term "cavity" may refer to a structure extending from an exposed surface of a substrate through the entirety of a layer of a substrate, such as a via. Moreover, the term "layer" as used herein may refer to a continuous layer, a semicontinuous layer having blanket regions and regions of isolated features, or a group of isolated features generally composed of the same material and disposed on a common layer or substrate.

In various embodiments, techniques are provided to fill a cavity using a novel combination of vapor deposition and directional sputtering. The process of the present embodiments may employ two components to deposit a material to fill a feature such as a cavity in a substrate while not creating a seam or buried hole within the cavity after the fill process is complete. The first component may be composed of a flux of neutral reactive precursor species, such as radical species generated in a plasma. A second component may be formed from a beam of directed energetic ions. As detailed below, in various embodiments, the directed energetic ions and the neutral reactive precursor species may be provided in alternating fashion or may be provided concurrently with one another. For a given ion species, energy, and angle of incidence at the substrate, the present embodiments provide various techniques for modulating the ratio of reactive precursor species (including both radicals and ions) to ion flux, where the control of this ratio provides control of the ability to form a seamless deposit within the cavity being filled.

In particular embodiments, directed ions may be provided toward a target area of a cavity, where sputtering of a depositing film or coating takes place in the targeted area. For example, the targeted area may include corner regions such as top corners of a trench or via, where sputtering of a depositing film helps avoid "overhang" or "bread loafing" during the filling of the cavity with the depositing material. As further disclosed in the embodiments to follow, the processes of the present embodiments may specifically target sputtering these corners by making use of energetic ion beams may be provided at controlled angles wheret the ions sputter material depositing on these features in an efficient manner, taking advantage of sputter yield dependence on ion incidence angle. At the same the energetic ion beams may be directed in a manner wherein few or no ions impinge upon the lower surface of the cavity, where deposition also takes place. This combination facilitates a result wherein the cavity is filled by the fill material in a bottom-up fill process. A feature of a bottom-up fill process in a process where at various stages of the filling of a cavity the net deposition of fill material is favored in lower regions of the cavity and is disfavored in at least some parts of upper regions of a cavity, such as along sidewall portions.

Figure 1A:
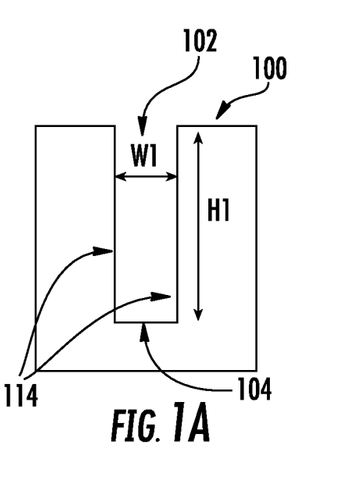
FIG. 1A to FIG. 1G depict exemplary operations in a method of filling a cavity in a substrate according to various embodiments of the disclosure.

FIG. 1A to FIG. 1G depict exemplary operations in a method of filling a cavity in a substrate according to various embodiments of the disclosure. In FIG. 1A, there is shown a side cross-sectional view of substrate 100 including a cavity 102 formed in the exposed surface of the substrate 100. The substrate 100 may be a bulk material, such as silicon, or may represent a layer of a given material, such as a layer of silicon, oxide, nitride, or other material, where the layer is disposed on another material, such as a substrate base. The substrate base (not separately shown) may in turn include any number of layers and structures. In one non-limiting example, the substrate 100 may be an insulator material to be filled with silicon. The cavity 102 may have a high aspect ratio where high aspect ratio means a ratio of a depth or height H1 of the cavity to a width W1 of the cavity 102 is greater than 1, in other words H1/W1>1. In some examples, the aspect ratio may be greater than 2, while in other examples the aspect ratio may be greater than 5 or greater than 10.

Figure 1B:
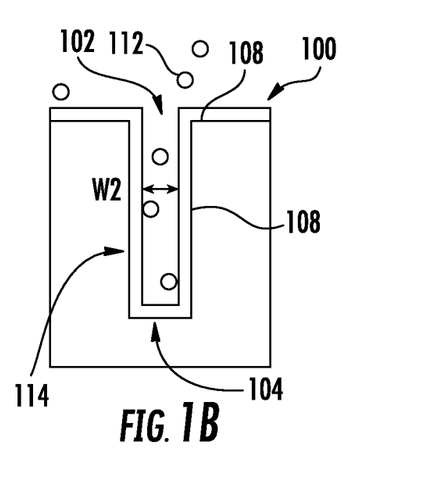

In the embodiments of FIGS. 1A-1G, deposition of a target material, such as silicon, may take place using depositing species, where the depositing species condense upon surfaces of the cavity 102. FIG. 1B depicts the structure of cavity 102 during an early stage of filling of the cavity with a depositing species 112. As illustrated, the depositing species 112 may condense on various surfaces of the cavity 102, forming the fill material 108. At this stage of processing, the fill material may have the structure of a somewhat conformal coating such as may be formed during initial stages of deposition using techniques such as chemical vapor deposition (CVD) or plasma enhanced CVD (PECVD), for example. The depositing species 112 may include reactive species, such as radicals, including neutral radicals. Following the example where the fill material 108 is silicon, a silane ($SiH_4$) gas may be used as a precursor to form the depositing species 112. In some examples, the depositing species 112 may be neutrals, where the neutrals impinge upon the substrate 100 over a wide range of trajectories, resulting in the coating structure shown. As a result, the depositing species 112 may condense on the sidewall portion(s) 114 as well as the lower surface 104. The depositing species 112 may be generated, for example, in a reaction chamber, such as a plasma chamber, where reactive neutrals derived from reactive neutral precursor, ions, and other reactive species may be generated. The embodiments are not limited in this context.

Figure 1C:
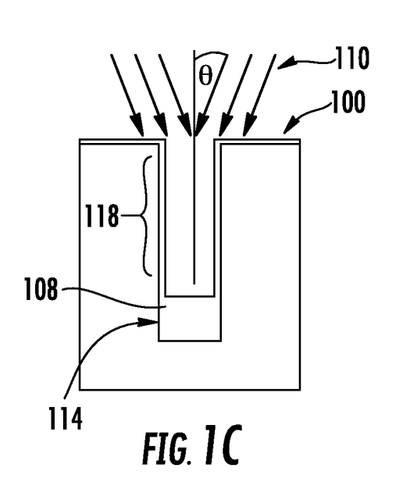

Turning now to FIG. 1C, there is shown a subsequent operation taking place after the stage shown in FIG. 1B. In this example, angled ions 110 are directed at the surface of the substrate 100. The angled ions 110 may, in particular, be directed at a non-zero angle of incidence with respect to a perpendicular to a plane defined by the substrate 100, as explained below.

Figure 1D:
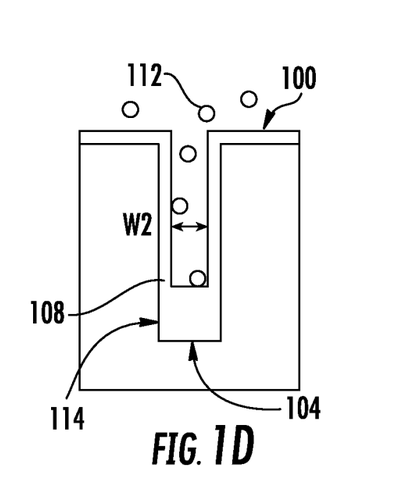
Figure 1E:
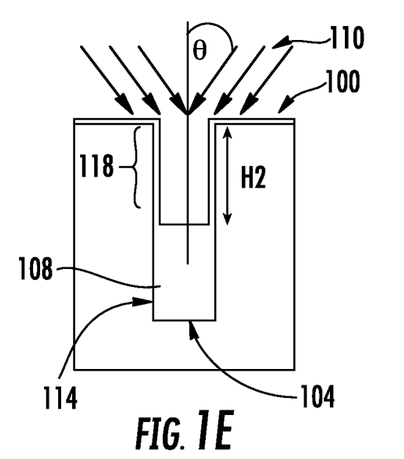
Figure 1F:
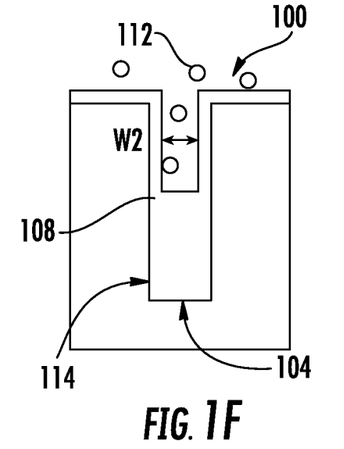
Figure 1G:
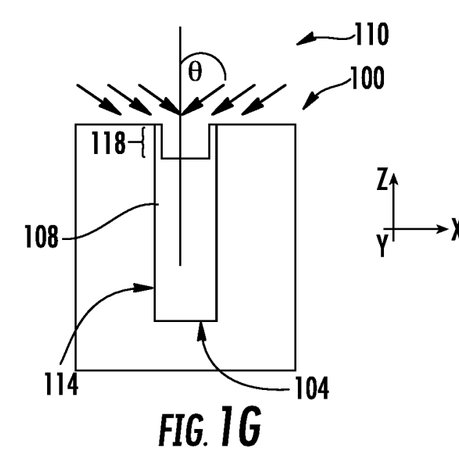
Figure 1H:
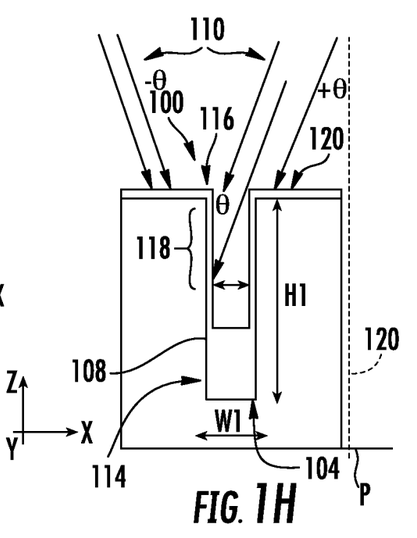
FIG. 1H shows details of the geometry of the angled ions with respect to a substrate.

Referring now also to FIG. 1H, there are shown details of the geometry of the angled ions 110 with respect to the substrate 100. As shown in FIG. 1H, the angled ions 110 may have trajectories shown by the arrows, where the angled ions 110 are directed at a non-zero angle of incidence with respect to a perpendicular 120 to the plane P defined by the substrate 100. This non-zero angle of incidence is represented by the angle θ as shown. For example, the substrate 100 may be a planar substrate such as a silicon wafer, where the silicon wafer extends parallel to the X-Y plane of the Cartesian coordinate system shown. The cavity 102 may be formed within the substrate 100 where the sidewall portions 114 extend at a steep angle with respect to the plane P, such as 80 degrees to 90 degrees. In the case where the sidewall portions 114 extend at 90 degrees with respect to the plane P, the sidewall portions 114 may be deemed to extend along the perpendicular 120. Accordingly, the angled ions 110 may strike the sidewall portions 114 at the same angle of incidence with respect to the surface of the sidewall portions, as also represented by θ.

By proper selection of the angle of incidence θ, as well as ion energy and ion type, for the angled ions 110, fill material 108 disposed on the sidewall portions 114, as well as fill material 108 disposed in corner regions 116 may be sputtered from those regions by the angle ions 110. For example, in various embodiments, the angled ions 110 may comprise an inert gas ions having an ion energy between 100 eV and 10 keV. The embodiments are not limited in this context. As is well known, the sputter yield of a given material subject to ion bombardment by a given ion increases with ion energy within a certain energy range. Generally, sputter yield, meaning the ratio of atoms of a given condensed material sputter etched from the condensed material to the number of ions incident on the material, is well below 1 for ion energies below 100 eV. Merely for the purposes of illustration, in the case of Argon ions incident at normal incidence upon a silicon surface, the sputter yield increases from a value on the order of 0.1 at 100 eV to a value on the order of 1 at 1000 eV. The sputter yield increases slightly up to 10 keV, and decreases slightly at higher energies. For other combinations of sputtering ions and material to be sputtered (target species), a similar qualitative behavior is observed, as is well known, while the quantitative values sputter yield curves are shifted according to factors such as the relative mass of the sputtering ion and material being sputtered. Additionally, the sputter yield for any given combination of ion and material to be sputtered exhibits a dependence on angle of incidence of ions. At normal incidence (θ is zero with respect to a perpendicular to the surface of the material), for a given ion energy the sputter yield has a finite value. For different ion species/target species combinations, the relative sputter yield may increase by a factor of 50%, 100%, or 200% with increasing angle of incidence θ, up to approximately 60 degrees. The sputter yield then decreases rapidly above approximately 70 degrees, reaching zero at 90 degrees.

The above-described sputter yield behavior may be harnessed by the processes shown at FIG. 1C and FIG. 1H, where the angled ions 110 may be directed at an appropriate ion energy and angle of incidence θ, so as to efficiently sputter part of the fill material 108 from an exposed part 118 of sidewall portions 114 and corner regions 116, where the exposed part 118 is exposed to the angled ions 110. In addition to removing fill material 108 from the exposed part 118 and corner regions 116, this exposure to the angled ions 110 may have the effect of redistributing some of the fill material 108, into lower regions of the cavity 102, including regions above the lower surface 104. Accordingly, the relative thickness (as measured parallel to the Z-axis) of fill material 108 near the lower surface 104 may increase with respect to the relative thickness of the fill material 108 (as measured parallel to the X-axis) along the sidewall portions 114, as shown in FIG. 1H.

Turning now to FIG. 1D, there is shown a subsequent operation, where the process generally described with respect to FIG. 1B may be repeated. At this instance, the angled ions 110 may not be directed to the substrate 100, so just the depositing species 112 impinge upon the cavity 102. As suggested in FIG. 1D, the fill material 108 may again tend to conformally coat the cavity 102 so the thickness of fill material on the sidewall portions 114 may increase, as well as the thickness of the fill material toward the lower surface 104. Accordingly, as compared to the earlier stage of processing shown in FIG. 1B, the amount of fill material 108 disposed toward the lower surface 104 is greater, while the amount of fill material 108 disposed along the sidewall portions 114 may not be substantially greater than the amount of fill material 108 disposed along sidewall portions 114 in FIG. 1B. Said differently, the width W2 of the open portion of cavity 102 may be comparable in the structure of FIG. 1B and FIG. 1D. In this manner, the cavity 102 may be filled in a bottom-up manner, where the thickness of the fill material 108 (along the Z-axis) increases preferentially in the vertical direction from the lower surface 104 with respect to the horizontal thickness of fill material 108 disposed along sidewall portions 114.

Turning now to FIG. 1E, there is shown a subsequent operation taking place after the stage shown in FIG. 1D. In this example, angled ions 110 are again directed at the surface of the substrate 100. The angled ions 110 may in particular be directed at a non-zero angle of incidence with respect to a perpendicular to a plane defined by the substrate 100, where this non-zero angle of incidence is represented by the angle of incidence θ as shown and described above with respect to FIG. 1H. In some embodiments the angle of incidence θ may be the same in the operations of FIG. 1C and FIG. 1E, while in other embodiments the angle of incidence θ may differ between the operations represented by FIG. 1C and FIG. 1E. For example, accounting for the thickness of the fill material 108, the height H2 of the cavity 102 in FIG. 1E is substantially less than H1. Accordingly, the angle of incidence θ may be increased with respect to the operation of FIG. 1C, since the exposed part 118 may be reduced in height due to reduced height of the cavity 102 as represented by H2. In other words, for a given width of the cavity 102, when the value of H2 is reduced, the angle of incidence θ may be increased to reduce the depth of the exposed part 118 to account for the reduced value of H2. The aforementioned operations of directing depositing material 112 and directing angled ions 110 may be repeated in alternating fashion for any number of times. This further processing is generally shown in FIG. 1F and FIG. 1G. Notably, in accordance with some embodiments of the disclosure, the angle of incidence θ may be chosen so in a given exposure to the angled ions 110, the angled ions 110 are shadowed by the sidewall portions 114 of the cavity 102 to the extent where the angled ions 110 do not impinge upon fill material 108 disposed at the bottom of the cavity 102. In this manner, fill material 108 may be efficiently sputtered from corner regions 116 and upper portions of the cavity 102 while not re-sputtering fill material 108 from the current bottom of the cavity 102.

Figure 2:
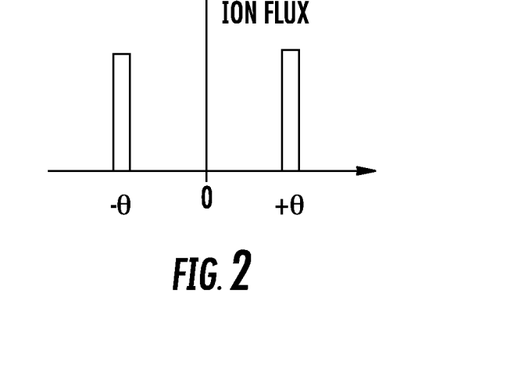
FIG. 2 showing an exemplary distribution of angled ions.

In various embodiments, to account for the specific geometry of the cavity 102, the angled ions 110 may be directed along multiple directions. For example, if the cavity 102 is a trench where sidewall portions 114 may be parallel to one another, the angled ions 110 may be directed in two different directions so as to expose the two different sidewall portions facing one another, as generally depicted in FIGS. 1C, 1E, and 1G. In particular, as further shown in FIG. 1H, the angled ions 110 may be directed in a manner where one portion of the angled ions 110 forms an angle (+) θ and another portion of the angled ions 110 forms an angle −θ with respect to the perpendicular 120. In some instances, the absolute value of (+) θ and −θ may be equal. The embodiments are not limited in this context. This geometry is suggested by the illustration of FIG. 2 showing an exemplary distribution of angled ions. As shown, the relative flux of ions as a function of incidence angle may be characterized by a bimodal distribution centered about zero degrees with respect to a perpendicular to a substrate plane.

In various embodiments, the operations of FIGS. 1A-1H may be performed using known beamline ion implantation apparatus, compact ion sources, or plasma based compact ion beam processing apparatus. The embodiments are not limited in this context.

Figure 3A:
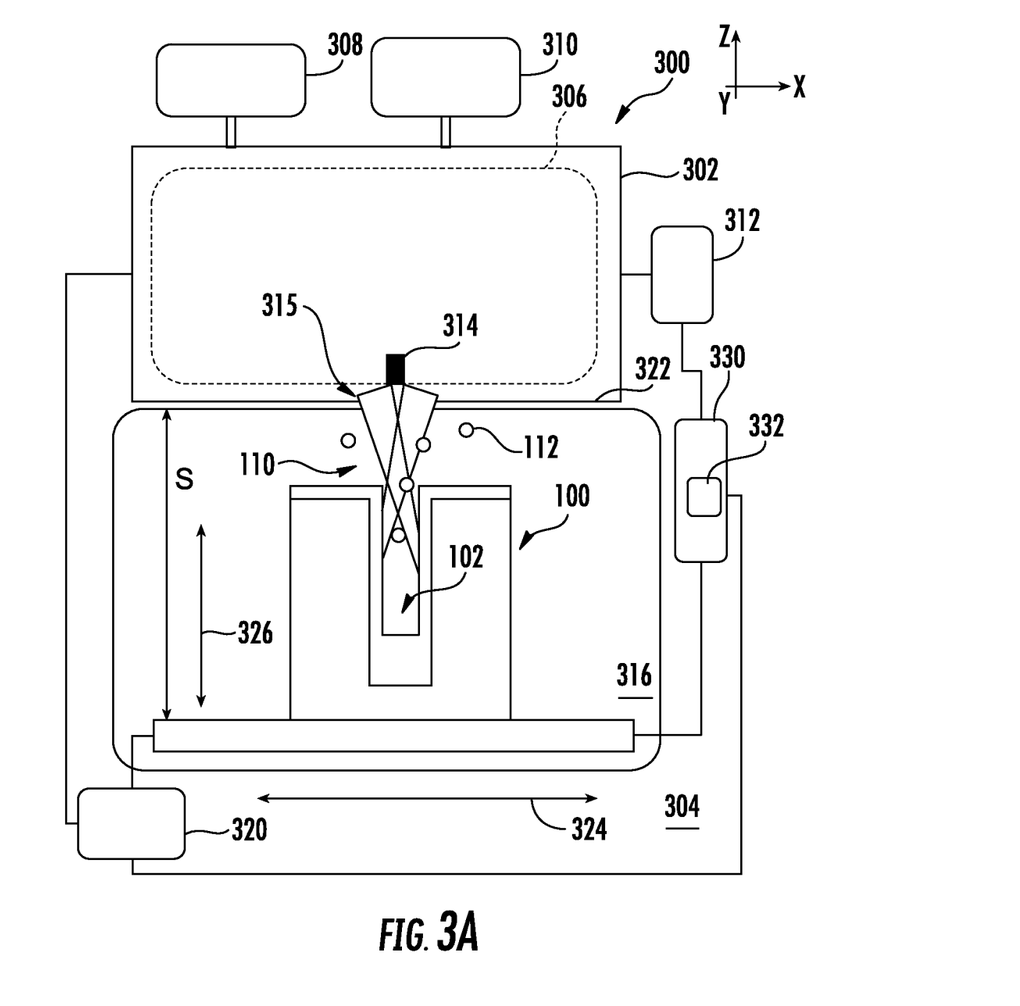
FIG. 3A depicts a processing apparatus according to embodiments of the disclosure.

FIG. 3A depicts a processing apparatus 300 appropriate for performing the operations of FIGS. 1A-1H. The processing apparatus 300 may include a plasma chamber 302 and a process chamber 304 disposed adjacent the plasma chamber 302. The processing apparatus 300 may generate the angled ions 110 as angled ribbon ion beams impinging upon the substrate 100. The processing apparatus 300 may include a first gas source 308 and a second gas source 310. In some embodiments, the first gas source 308 and second gas source may represent a gas manifold coupled to a plurality of individual gas sources. The first gas source 308 may be used to provide a first gas flow to provide a gas species to the plasma chamber to generate the angled ions 110, such as inert gas species, including argon, krypton, neon, and so forth. In some embodiments, the second gas source 310 may provide to the plasma chamber 302 a precursor gas flow where the precursor gas includes gas species to generate the depositing species 112. In other embodiments, the second gas source 310 may provide gas species directly to the process chamber 304 to generate the depositing species 112.

The processing apparatus 300 may further include a plasma generator 312 where the plasma generator 312 may represent a known power source and applicator to generate a plasma 306 in the plasma chamber 302. Examples of a plasma generator 312 include an RF plasma source, inductively-coupled plasma (ICP) source, capacitively coupled plasma (CCP) source, helicon source, electron cyclotron resonance (ECR) source), indirectly heated cathode (IHC) source, glow discharge source, or other plasma sources known to those skilled in the art.

In one example, when gas from the first gas source 308 is provided to the plasma chamber 302 and the plasma generator directs power to the plasma chamber 302 a plasma 306 may be generated. Additionally, according to some embodiments gas from the second gas source 310 may be provided to the plasma chamber 302 to generate a plasma. In one example for filling the cavity 102 with silicon, $SiH_4$ may be provided from the second gas source 310 while Ar is provided from the first gas source 308. The plasma 306 may accordingly include Ar ions as well as ions derived from $SiH_4$, and reactive neutrals such as radicals derived from the $SiH_4$ gas. According to different embodiments, these components may be directed to the substrate 100 to produce the sequence of operations shown in FIGS. 1A-1H. Notably in FIG. 3A the cavity 102 may not be drawn to scale, where the cavity 102 may have dimensions on the order of 1 nanometer, 10 nanometers, 100 nanometers, 1 micrometer, or 10 micrometers, for example, while the process chamber has dimensions on the order of centimeters to tens of centimeters.

To generate the angled ions 110 as ion beams, a bias voltage may be applied between the plasma chamber 302 and substrate 100. In particular, the processing apparatus 300 may include a substrate holder 316 and a bias voltage source 320, where the bias voltage source 320 generates a voltage difference between the substrate holder 316 and plasma chamber 302. For example, the substrate holder 316 and the process chamber 304 may be connected to ground potential, while the bias voltage source 320 establishes a positive voltage at the plasma chamber 302, such as +500 V. In this manner, the plasma 306 may assume a potential of approximately +500 V to +520 V, causing positive ions from the plasma 306 to be attracted to the substrate 100, experiencing an acceleration to approximately 500 eV energy for singly ionized ions. In particular embodiments, the processing apparatus may include an extraction plate 322, where the extraction plate 322 is disposed between the plasma chamber 302 and substrate 100.

Figure 3B:
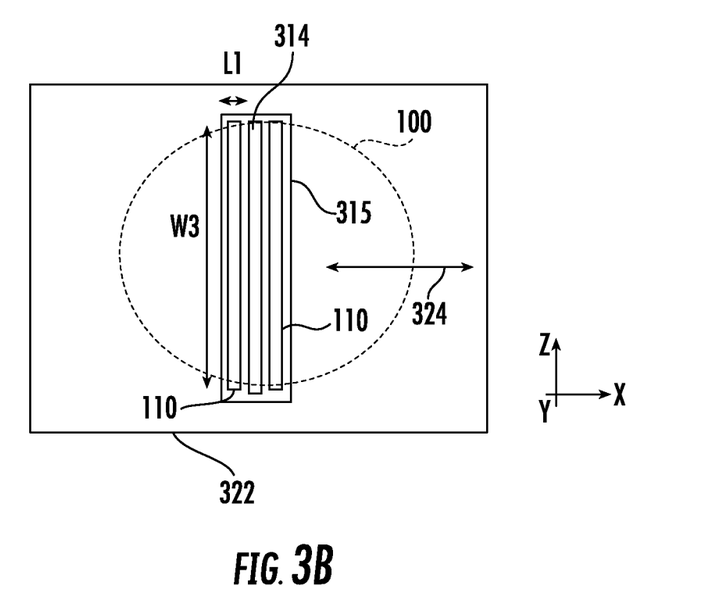
FIG. 3B shows an embodiment of an extraction plate in a top plan view.

In some embodiments, the extraction plate 322 may include an extraction aperture 315, where ions from the plasma 306 are extracted as angled ribbon ion beams. Turning now to FIG. 3B there is shown an embodiment of the extraction plate 322 in a top plan view from the point of view of the plasma chamber 302. The extraction aperture 315 may be an elongated aperture, wherein the angled ions 110 form a ribbon beam, or in this case a pair of ribbon ion beams. The ribbon ion beam or ribbon ion beams may have a beam width W3 and a beam length L1, wherein a ratio of the beam width W3 to the beam length L1 is greater than 5.

To generate the angled ions 110, the processing apparatus 300 may include a beam blocker 314, where the beam blocker 314 establishes two separate ion beams as shown. According to known beam blocker and extraction plate configurations, the beam blocker 314 and extraction plate 322 may be arranged to generate a plasma sheath boundary, where the plasma sheath boundary directs the angled ions 110 at a non-zero angle of incidence as discussed above. In particular, the angled ions 110 may be generated as two ribbon ion beams as illustrated in FIG. 3B, where one ribbon ion beam of the angled ions 110 forms an angle (+) $\theta$ and ribbon ion beam of the angled ions forms an angle $\theta$ with respect to the perpendicular 120, as shown in FIG. 1H.

In accordance with various embodiments of the disclosure, the substrate holder 316 may be movable along the direction 324, such as along the X-axis. In this manner the entirety of the substrate 100 may be scanned under the extraction aperture 315 to provide exposure to the angled ions. In this manner, in examples where the substrate 100 includes many cavities, the different cavities may be exposed during the scanning of the substrate 100. In addition, the substrate holder 316 may be movable along the direction 326, such as along the Z-axis.

In various embodiments, the angle of incidence $\theta$ may be varied by varying one or more parameters. In particular, the plasma power of plasma 306, the gas pressure in chamber in plasma chamber 302, as well as the separation along the Z-axis between extraction plate and the substrate 100 may be varied in order to change the angle of incidence $\theta$. The embodiments are not limited in this context. For example, by increasing plasma power of gas pressure may generate a smaller angle of incidence. The increasing of an electric field between the plasma 306 and substrate 100 may generate a larger angle of incidence. In particular, for a given bias voltage applied between substrate 100 and plasma chamber 302, the electric field may be increased by decreasing the separation S; or alternatively the bias voltage at a fixed value of separation S may be increased, yielding the same result.

In accordance with various embodiments, the controller 330 may be embodied in any combination of software and hardware, including memory and logic such as control logic. The controller 330 may be coupled to the bias voltage source 320, the plasma generator 312, the first gas source 308, and second gas source 310, where the controller 330 includes a component 332, such a logic or software to control various parameters including a bias voltage signal applied to the substrate holder 316, the reactive precursor gas flow, the sputtering gas flow, in a manner to generate a fill process wherein the angled ions sputter etch a portion of the fill material from a sidewall portion of a cavity as discussed above.

The ability to change angle of incidence $\theta$ by varying such operating parameters, affords a convenient means for dynamically changing incidence angle during processing, since parameters including plasma power, gas pressure, separation S may readily be changed either by manual intervention of an operator or by automatic control. For example, the processing apparatus 300 may include a controller 330. The controller 330 may be embodied in any combination of software and hardware, including memory, a computer readable medium, and logic such as control logic. The controller 330 may be coupled to various components of the apparatus such as plasma generator 312, substrate holder 316, and bias voltage supply 320. In operation, the controller 330 may send control signals to vary operation of any of these components, having the effect of varying angle of incidence $\theta$ among other features.

Figure 4A:
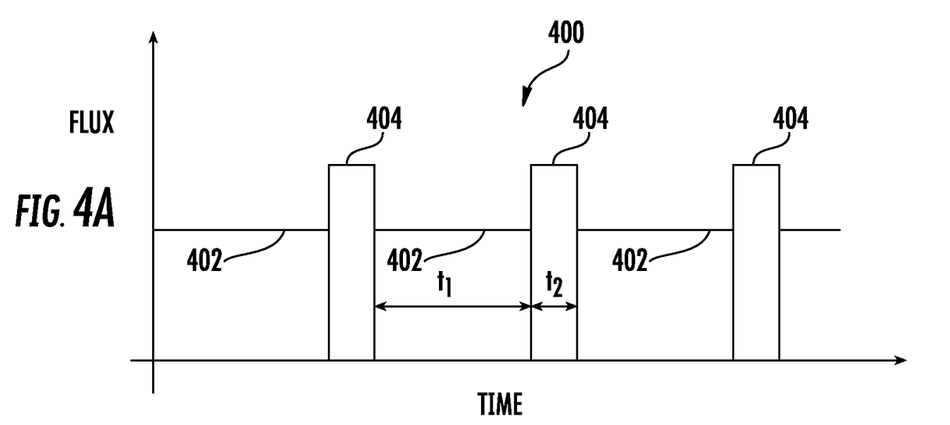
FIG. 4A shows a graphic depiction of a processing sequence according to various embodiments of the disclosure.

Turning now to FIG. 4A, there is shown a graphic depiction of a processing sequence 400, representing a variant of the operations shown in FIGS. 1A-1H. In particular, FIG. 4A presents a graph showing relative flux of different species directed to a substrate as a function of time. In this variant, the depositing species are provided as plurality of deposition pulses, shown as deposition pulses 404. In one example, the deposition pulses may be provided by flowing a pulse of precursor gas such as silane ($SiH_4$) into a plasma chamber, or a process chamber, where the precursor gas generates the depositing species 112, such as silicon containing radicals. The pulse of precursor gas may be provided over a time scale wherein a duration of an individual pulse of the plurality of deposition pulses comprises 1 second to 1000 seconds. The embodiments are not limited in this context. Additionally, according to the processing sequence 400 of FIG. 4A, a plurality of sputtering intervals, shown as sputtering intervals 402, alternate with the deposition pulses 404. Again, the duration of an individual sputtering interval, i.e., a sputtering interval 402, of the plurality of sputtering intervals may comprise 1 second to 1000 seconds.

As shown in FIG. 4A, during the sputtering intervals, 402 the deposition pulses 404 do not take place. Said differently, the deposition pulses 404 do not overlap with the sputtering intervals 402. In one particular embodiment for filling a cavity in a substrate with silicon, the processing sequence may be accomplished in the following manner. An inert gas such as argon gas may be introduced into a plasma chamber and a plasma containing argon ions generated. To initiate a sputtering interval 402, a bias voltage may be established by a bias voltage supply between a substrate and the plasma chamber, such as −500 V with respect to the plasma. The processing may be switched from a sputtering interval 402 to a deposition pulse 404 by extinguishing the bias voltage between the plasma chamber and substrate. At the same time as bias voltage is extinguished, a gas source containing $SiH_4$ may be enabled to flow $SiH_4$ to the plasma chamber to initiate the deposition pulse 404. Subsequently, the flow of $SiH_4$ may be terminated to end the deposition pulse and the bias voltage may be simultaneously reestablished, to initiate another sputtering interval.

In other embodiments, consistent with the processing sequence 400 shown in FIG. 4A, a sputtering interval 402 may be terminated by extinguishing a bias voltage and by ceasing to flow an inert gas.

Figure 4B:
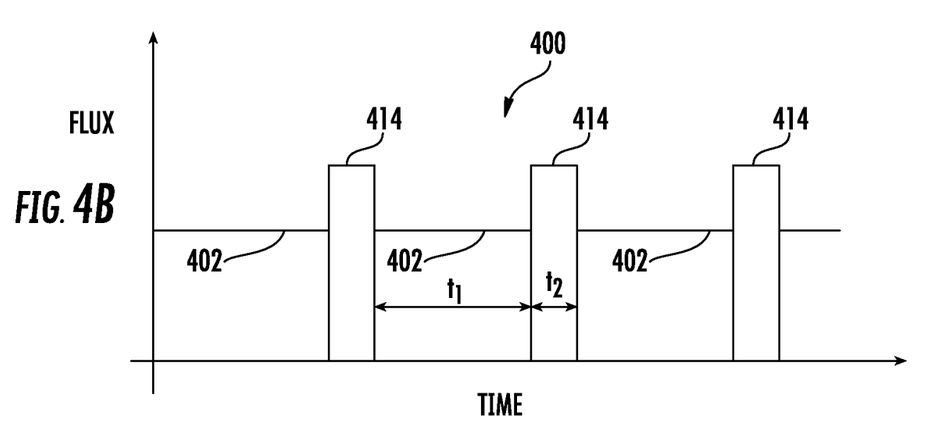
FIG. 4B shows a graphic depiction of another processing sequence according to other embodiments of the disclosure.

Turning now to FIG. 4B, there is shown a graphic depiction of a processing sequence 410, representing a modification of the operations shown in FIGS. 1A-1H. In particular, FIG. 4B also presents a graph showing relative flux of different species directed to a substrate as a function of time. A difference in the processing sequence 410 of FIG. 4B and the process sequence 400 of FIG. 4A lies in the continuous provision of sputtering ions. In this embodiment, the sputtering intervals 402 may constitute periods where a plasma having inert gas ions and a bias voltage is established between the substrate and plasma chamber, as described previously. Notably, in this variant, the depositing species may be provided as plurality of deposition pulses, shown as deposition pulses 414, where the deposition pulses are provided by flowing a pulse of precursor gas to generate the depositing species. Notably, the provision of sputtering ions may continue during the deposition pulses 414, for example, by continuing to provide inert gas ions to a plasma chamber and continuing to apply a bias voltage between a substrate and plasma chamber. Accordingly, the deposition pulses 414 correspond to periods where both depositing species and sputtering ions are provided to a substrate. The flux of depositing species may be set to a level where net deposition of fill material into a cavity takes place, while the depositing species are selectively filled into the cavity in a bottom-up process by promotion of resputtering of fill material disposed in exposed parts 118 and corner regions 116.

Figure 5A:
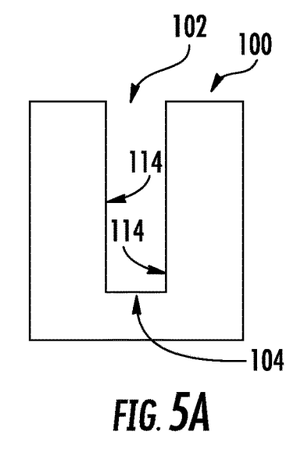
FIG. 5A to FIG. 5E depict exemplary operations in a method of filling a cavity in a substrate according to various additional embodiments of the disclosure.
Figure 5B:
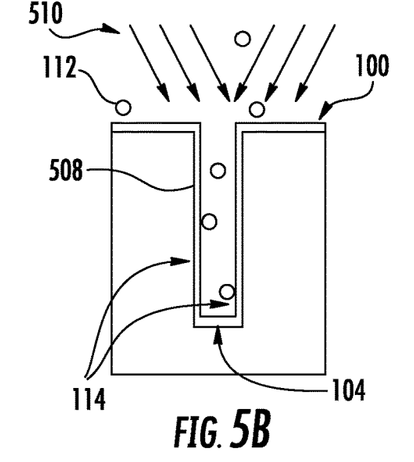
Figure 5C:
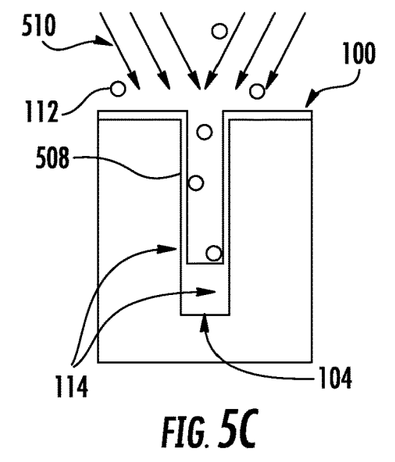
Figure 5D:
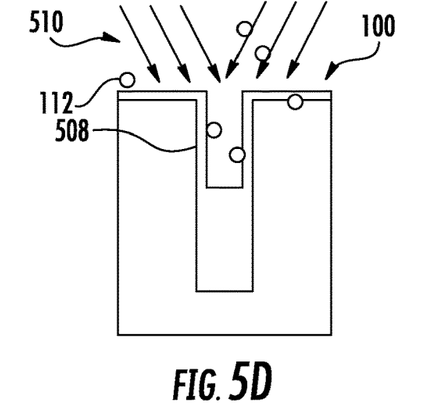
Figure 5E:
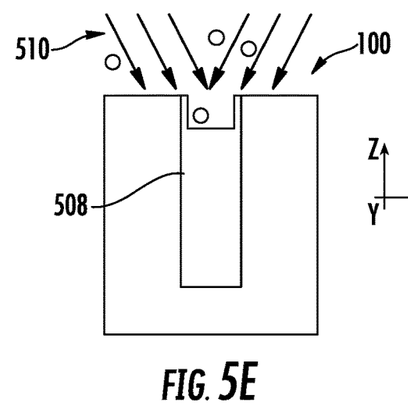

FIG. 5A to FIG. 5E depict exemplary operations in a method of filling a cavity in a substrate according to various additional embodiments of the disclosure. In FIG. 5A, there is shown a side cross-sectional view of substrate 100 including a cavity 102 as described above with respect to FIG. 1A.

FIG. 5B and FIGS. 5C-5E depict different instances during processing of the cavity 102 where the cavity 102 is concurrently exposed to angled ions 110 and depositing species 112. As illustrated, the depositing species 112 may condense on various surfaces of the cavity 102, forming the fill material 508, while the angled ions 110 tend to limit the growth of fill material 508 along sidewall portions 114 and favor growth of fill material 508 from the lower surface 104, as described above with respect to FIGS. 1A-1H. In embodiments generally depicted in FIG. 5A-5E, the ratio of sputtering ions to depositing species may be controlled in order to promote net deposition of fill material in a bottom-up manner. In some embodiments, the provision of ions 510 and depositing species 112 may be performed in a quasi-concurrent fashion, where ions 510 are provided in a series of very short pulses, creating angled ion pulses such as pulses lasting less than one millisecond (ms). These angled ion pulses may constitute pulses of an angled ion beam comprising angled ions incident at a surface of the substrate at a non-zero angle of incidence as defined herein. The embodiments are not limited in this context. Accordingly, for a deposition sequence lasting many seconds or minutes, depositing species 112 may be deposited in a continuous fashion, while ions 510 are provided in very short pulses, where the very short pulses provide an average exposure to ions 510 over a period of seconds determined by the duty cycle of pulses of ions 510.

In particular embodiments, the pulses of ions may be provided by providing a pulsed bias voltage between a substrate and plasma chamber. In some embodiments, the bias voltage source 320 may provide voltage pulses, such as sub-ms voltage pulses, to generate a cavity fill process generally illustrated in FIGS. 5A-5E. According to various embodiments, an appropriate mix ratio may be determined, where the mix ratio comprises a ratio of deposition gas (such as $SiH_4$ or $CH_4$) to provide the depositing species to inert gas, to provide an inert sputtering species (such as Ar or Kr). The mix ratio may be determined in a manner wherein no net deposition takes place at portions of a cavity where the ions strike, while net deposition takes place just at lower surfaces m of the cavity where no ions strike. The mix ratio may then be held constant during a process sequence.

Figure 6A:
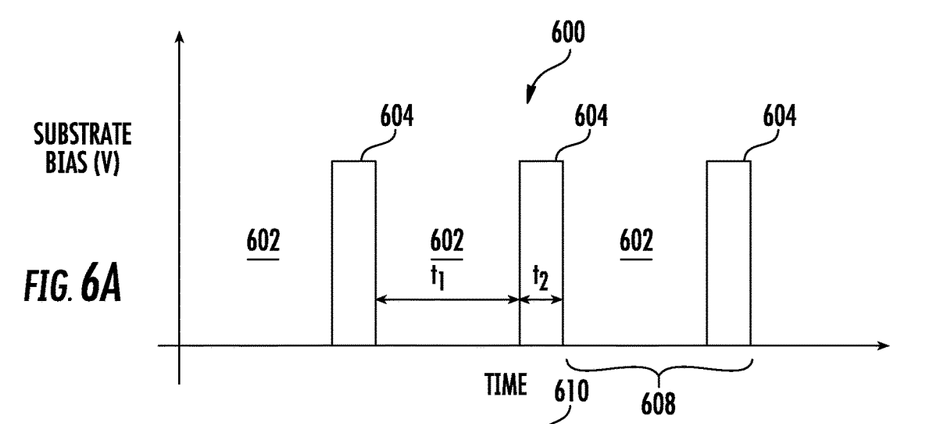
FIG. 6A depicts a processing sequence according to some embodiments of the disclosure.

FIG. 6A depicts a processing sequence 600 according to some embodiments of the disclosure. The processing sequence 600 may include a series of bias voltage pulses, shown as bias voltage pulses 604. The bias voltage pulses 604 may be generated, for example, by the bias voltage supply 320 discussed above. As further illustrated in FIG. 6A, the series of bias voltage pulses alternate with a series of deposition pulses, shown as deposition pulses 602. As shown in FIG. 6A, the processing sequence 600 may be characterized by a process period 608, where the process period is the duration t1 spent for a deposition pulse 602 followed by the duration t2 for a bias voltage pulse 604. In various embodiments, the duration of the process period 608 may be on the order of a few ms or less, and in some examples, may be less than 1 ms. Accordingly, the duration t1 as well as the duration t2 may be less than 1 ms. According to one implementation, to generate the processing sequence 600 a plasma may be generated in a plasma chamber 302, by flowing inert gas and silane into the plasma chamber. During the deposition pulses 602, no bias voltage may be applied between the substrate 100 and plasma chamber 302. Accordingly, the deposition pulses 602 may correspond to intervals where depositing species 112 are provided to the substrate 100 while no ions are directed to the substrate 100. The bias voltage pulses 604 may correspond to instances when a bias voltage, such as a bias voltage of greater than −100 V is applied between the substrate 100 and plasma chamber 302, meaning the substrate 100 is biased negatively with respect to the plasma chamber 302. In these instances, the scenario may correspond to the scenario generally depicted in FIGS. 5B-5E, where depositing species 112 and angled ions 110 are provided concurrently to the substrate 110.

Notably, the ratio of angled ions 10 to depositing species 112 over a relatively longer time scale may be controlled by controlling the duty cycle of bias voltage pulses 604, where the duty cycle=t2/(t2+t1) within the meaning of FIG. 6A described above. For example, t2 may equal 100 μs while t1=400 μs, giving a process period of 500 μs and a duty cycle of 20%. To optimize processing for filling a cavity, the duty cycle may be varied for a given process period, inert gas ion, depositing species, bias voltage, and so forth. For example, the use of a 10% duty cycle may be determined to yield cavities, where such cavities when filled with a fill material have defects such as seams or buried inclusions. The use of a 50% duty cycle may be determined to yield a filled cavity where no defects are observed in the filled material in the cavity, while the duration for filling is unacceptably long. The use of a 20% duty cycle may be determined to yield a filled cavity where no defects are observed in the filled material in the cavity, while the duration for filling is acceptable. Accordingly, the 20% duty cycle may be selected for processing. Notably, over a relatively longer time scale such as one second or more, the processing sequence 600 may be approximated by the scenario of FIGS. 5B-5C, since the duration between successive pulses of bias voltage pulses 604 may be on the order of hundreds of microseconds or less, so angled ions, such as ions 510, "appear" to be provided in a continuous manner. In the implementation of the processing sequence 600 where the process period 608 is less than 1 ms, less than one monolayer of fill material, such as fill material 508, may be formed in any given process cycle. In this manner, the amount of fill material 508 remaining along sidewall portions 114 may be maintained at a minimal thickness as targeted.

Figure 6B:
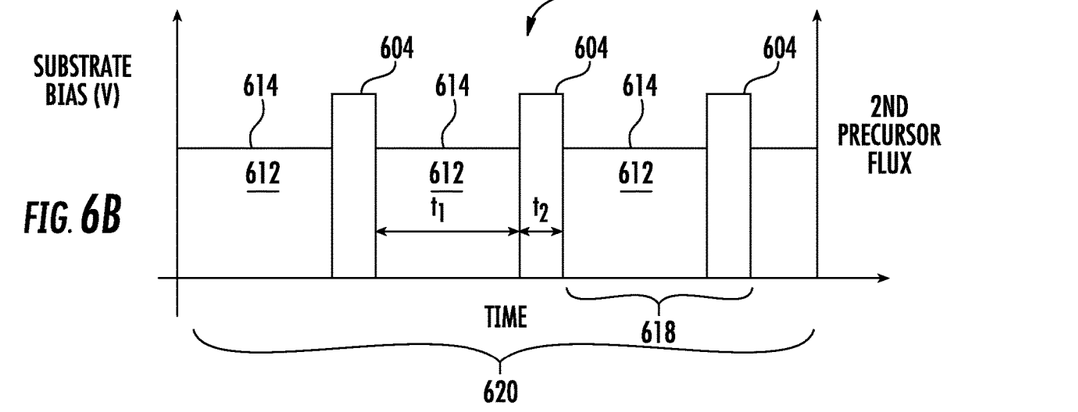
FIG. 6B-6D depicts another processing sequence according to some embodiments of the disclosure.
Figure 6C:
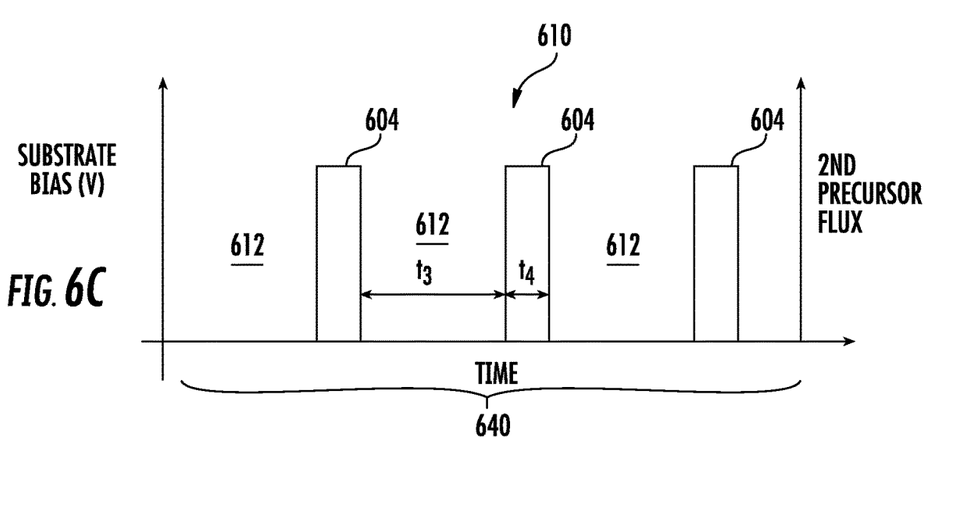
Figure 6D:
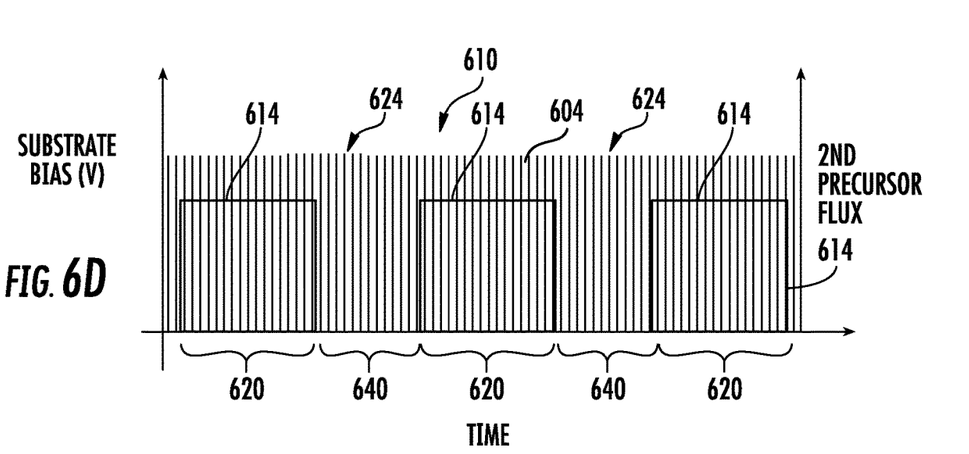

FIG. 6B depicts another processing sequence 610 according to additional embodiments of the disclosure. The processing sequence 610 may include a series of bias voltage pulses, shown as bias voltage pulses 604 described above. As further illustrated in FIG. 6B, the series of bias voltage pulses alternate with a series of deposition periods, shown as deposition periods 612. As shown in FIG. 6B, the processing sequence 600 may be characterized by a process period 618, where the process period is the duration t3 spent for a deposition period 612 followed by the duration t4 for a bias voltage pulse 604. In various embodiments, the duration of the process period 618 t4, and t3 may be similar to corresponding values discussed above with respect to FIG. 6A. A difference in the processing sequence 610 from processing sequence 600 lies in the provision of a second precursor shown as second precursor pulse 614, during the deposition periods 612. The second precursor may be used to modulate ion sputtering, for example. In various embodiments, the second precursor pulse 614 may be provided over a process interval 620, lasting approximately 1 second to 1000 seconds. The embodiments are not limited in this context. In time intervals between the second precursor pulses 614, the bias voltage pulses 604 may be continued, while just a first precursor is provided as described in the above embodiments. Turning now to FIG. 6C there is shown a different instance of the processing sequence 610, shown as the process interval 640, where no second precursor is present. During the process interval 640 the bias voltage pulses 604 continue to be provided as shown, and may be provided over time scales of less than one millisecond (ms) in some examples. Again the process interval 620 may have a comparable duration to the process interval 620. Turning now to FIG. 6D, there is shown another view of the processing sequence 610. Notably, the time scale of the views in FIG. 6B and FIG. 6C may be on the order of a few milliseconds or less, while the time scale of FIG. 6D may be on the order of one second to hundreds of seconds. Accordingly, as shown in FIG. 6D, the second precursor pulses 614 may be provided over the scale of seconds to hundreds of seconds, alternating with single precursor periods 624, where just one precursor is provided. During the entirety of the processing sequence 610, the bias voltage pulses 604 may continue to be provided as shown, in addition to the provision of the first precursor, to be used for depositing material.

In one example, the processing sequence 610 may be used to fill a cavity with a silicon oxide material. In one implementation, silane gas may be provided as the first precursor, where the silane gas is provided continuously during the entirety of the processing sequence 610, while bias voltage pulses 604 are also provided continuously. Every few seconds a second precursor pulse 614 may be added, where the second precursor pulse 614 is composed of $O_2$. Therefore, $SiO_x$ fill material may be deposited where the stoichiometry may be controlled by the duty cycle of the second precursor pulses 614. In other embodiments, the second precursor pulses may be composed of an inert gas. The first precursor may be silane in one example, while the second precursor pulses 614 are pulses of argon. This scenario may accordingly modulate the plasma density and sputtering species generated during the bias voltage pulses 604.

Figure 7:
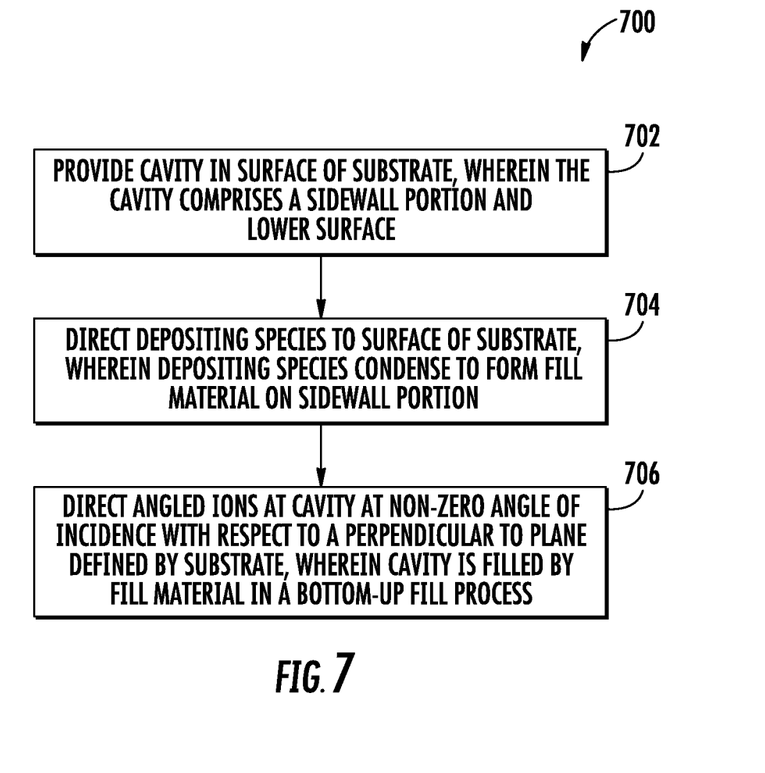
FIG. 7 depicts an exemplary process flow.

FIG. 7 presents an exemplary process flow 700, according to embodiments of the disclosure. At block 702, a cavity is provided in a surface of a substrate, where the cavity includes a sidewall portion and a lower surface. In different embodiments, the cavity may be a trench or a via. At block 704, depositing species may be directed to the surface of the substrate, where the depositing species condense to form a fill material on the sidewall portions. The depositing species may further condense to form fill material on the lower surface. The depositing species may include reactive species, such as radicals, including neutral radicals. The depositing species may be neutrals, where the neutrals impinge upon the substrate over a wide range of trajectories. At block 706, angled ions are directed at the cavity at a non-zero angle of incidence with respect to a perpendicular to plane defined by substrate, wherein the cavity is filled by the fill material in a bottom-up fill process. In particular, angled ions may serve to redistribute the fill material, where fill material is removed from regions of the sidewall portions exposed to the angled ions, and where at least some of the removed fill material redeposits toward the lower surface of the cavity.

There are multiple advantages provided by the present embodiments, including the ability to maintain an open cavity in a continuous fashion during a cavity fill process by providing angled ions to sputter material depositing in exposed regions of a cavity. A second advantage is the ability to harness the sputtered material for filling the cavity, by redepositing the sputtered material toward lower regions of a cavity, to help fill in the cavity in a bottom-up seamless fashion.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   providing a cavity in a surface of a substrate, the cavity comprising a sidewall portion and a lower surface;
   directing a depositing species to the surface of the substrate via chemical vapor deposition, wherein the depositing species condense to form a fill material on the sidewall portion and lower surface;
   directing angled ions at the cavity at a first non-zero angle of incidence with respect to a perpendicular to a plane defined by the substrate, wherein the angled ions strike the fill material on the sidewall portion and do not strike the fill material on the lower surface; and
   directing angled ions at the cavity at a second non-zero angle of incidence with respect to the perpendicular to the plane defined by the substrate, the second non-zero angle of incidence greater than the first non-zero angle of incidence, wherein the angled ions strike the fill material on the sidewall portion and do not strike the fill material on the lower surface;
   wherein the cavity is filled by the fill material in a bottom-up fill process and
   wherein the depositing species comprise reactive neutral precursors derived from a plasma chamber adjacent the substrate and
   wherein the directing the angled ions comprises extracting the angled ions through an extraction plate disposed between the plasma chamber and the substrate.

2. The method of claim 1, wherein the non-zero angle of incidence is less than 45 degrees and greater than 10 degrees.

3. The method of claim 1, wherein the cavity comprises a height and a width, wherein an aspect ratio comprising a ratio of the height to the width is greater than 1.

4. The method of claim 1, wherein the extraction plate comprises an elongated aperture, wherein the angled ions comprise a ribbon beam having a beam width and a beam length, wherein a ratio of the beam width to the beam length is greater than 5.

5. The method of claim 1, wherein the directing the depositing species and the directing the angled ions take place simultaneously.

6. The method of claim 1, wherein the directing the depositing species comprises providing the depositing species in a plurality of deposition pulses.

7. The method of claim 6, wherein the angled ions are provided in a plurality of sputtering intervals, wherein the plurality of sputtering intervals alternate with the plurality of deposition pulses.

8. The method of claim 7, wherein a duration of an individual pulse of the plurality of deposition pulses comprises 1 second to 1000 seconds, and an individual sputtering interval of the plurality of sputtering intervals comprises 1 second to 1000 seconds.

9. The method of claim 6, wherein the angled ions are provided continuously including during the deposition pulses.

10. The method of claim 5, wherein the angled ions and depositing species are generated in a plasma chamber, the plasma chamber disposed adjacent the substrate, and wherein the directing the angled ions comprises extracting the angled ions in a series of angled ion pulses through an extraction plate disposed between the plasma chamber and substrate.

11. The method of claim 10, wherein the series of angled ion pulses are generated by generating a series of bias voltage pulses between the plasma chamber and substrate, wherein a bias voltage pulse of the series of bias voltage pulses comprises a duration of 100 µs to 100 ms, and wherein an interval between bias voltage pulses comprises a duration of 100 µs to 100 ms.

12. The method of claim 11, wherein the depositing species are provided in a processing sequence, the processing sequence comprising:
    a first process interval when just a first precursor is provided to the substrate; and
    a second process interval when the first precursor and a second precursor are provided to the substrate, the second process interval alternating with the first process interval, wherein the first process interval and second process interval comprise a duration of 1 second to 1000 seconds, and wherein the bias voltage pulses are provided during the first process interval and second process interval.

* * * * *